US012681091B2

(12) United States Patent
Lim

(10) Patent No.: US 12,681,091 B2
(45) Date of Patent: Jul. 14, 2026

(54) BATTERY MANAGEMENT APPARATUS AND METHOD

(71) Applicant: LG ENERGY SOLUTION, LTD., Seoul (KR)

(72) Inventor: Bo Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 548 days.

(21) Appl. No.: 18/031,431

(22) PCT Filed: Oct. 19, 2021

(86) PCT No.: PCT/KR2021/014592
§ 371 (c)(1),
(2) Date: Apr. 12, 2023

(87) PCT Pub. No.: WO2022/139143
PCT Pub. Date: Jun. 30, 2022

(65) Prior Publication Data
US 2023/0408583 A1 Dec. 21, 2023

(30) Foreign Application Priority Data
Dec. 24, 2020 (KR) ........................ 10-2020-0183970

(51) Int. Cl.
*G01R 31/367* (2019.01)
*G01R 31/382* (2019.01)
(52) U.S. Cl.
CPC ......... *G01R 31/367* (2019.01); *G01R 31/382* (2019.01)

(58) Field of Classification Search
None
See application file for complete search history.

(56) References Cited

U.S. PATENT DOCUMENTS

| | | | |
|---|---|---|---|
| 2011/0012604 A1 | 1/2011 | Tsujiko et al. | |
| 2013/0119940 A1 | 5/2013 | Iriyama et al. | |
| 2015/0066406 A1* | 3/2015 | Sun ...................... | G01R 31/392 |
| | | | 702/63 |
| 2015/0200425 A1 | 7/2015 | Iriyama et al. | |
| 2016/0061908 A1 | 3/2016 | Torai et al. | |
| 2016/0066406 A1 | 3/2016 | Chen et al. | |

(Continued)

FOREIGN PATENT DOCUMENTS

| | | |
|---|---|---|
| CN | 103785629 B | 10/2015 |
| CN | 107064805 A | 8/2017 |

(Continued)

OTHER PUBLICATIONS

Translated specification of CN103785629 (abstract disclosed in IDS from applicant) (Year: 2014).*

(Continued)

*Primary Examiner* — Oluseye Iwarere
(74) *Attorney, Agent, or Firm* — Birch, Stewart, Kolasch & Birch, LLP

(57) ABSTRACT
Provided is a battery management apparatus including a calculating unit for calculating a differential value of a capacity of a battery cell with respect to a voltage of the battery cell, an analyzing unit for performing statistical analysis on the differential value, and a determining unit for determining the capacity of the battery cell based on the statistical analysis.

12 Claims, 10 Drawing Sheets

(56) References Cited

U.S. PATENT DOCUMENTS

| | | | |
|---|---|---|---|
| 2016/0209472 A1 | 7/2016 | Chow et al. | |
| 2017/0212170 A1 | 7/2017 | Torai et al. | |
| 2018/0170802 A1 | 6/2018 | Li et al. | |
| 2019/0011505 A1 | 1/2019 | Park et al. | |
| 2019/0113577 A1 | 4/2019 | Severson et al. | |
| 2019/0317150 A1 | 10/2019 | Park et al. | |
| 2020/0203780 A1 | 6/2020 | Mandli et al. | |
| 2020/0225292 A1 | 7/2020 | Ukumori et al. | |
| 2020/0284846 A1* | 9/2020 | Pajovic | G01R 31/396 |
| 2021/0293890 A1* | 9/2021 | Gorrachategui | G01R 31/367 |
| 2021/0325469 A1 | 10/2021 | Torai | |
| 2023/0305069 A1* | 9/2023 | Sun | H01M 10/48 |

FOREIGN PATENT DOCUMENTS

| | | | |
|---|---|---|---|
| CN | 111693882 B | 9/2022 | |
| EP | 3 196 663 B1 | 10/2018 | |
| JP | 3263336 B2 | 3/2002 | |
| JP | 2012-54220 A | 3/2012 | |
| JP | 5354416 B1 | 11/2013 | |
| JP | 2016-53564 A | 4/2016 | |
| JP | 2017-20916 A | 1/2017 | |
| JP | 6380417 B2 | 8/2018 | |
| JP | 2019-20392 A | 2/2019 | |
| JP | 2019-113524 A | 7/2019 | |
| JP | 2020-68606 A | 4/2020 | |
| JP | 2020-106470 A | 7/2020 | |
| KR | 10-2016-0090226 A | 7/2016 | |
| KR | 10-1772036 B1 | 8/2017 | |
| KR | 10-1878538 B1 | 7/2018 | |
| KR | 10-1882287 B1 | 7/2018 | |

OTHER PUBLICATIONS

International Search Report (PCT/ISA/210) issued in PCT/KR2021/014592, dated Feb. 3, 2022.

Extended European Search Report for European Application No. 21911210.9, dated Mar. 7, 2024.

Vatani et al., "State of Health Prediction of Li-ion Batteries using Incremental Capacity Analysis and Support Vector Regression," IEEE Milan PowerTech, 2019, 6 pages total.

Chinese Office Action and Search Report for Chinese Application No. 202180068892.7, dated Sep. 24, 2025, with partial English translation.

* cited by examiner

BATTERY MANAGEMENT APPARATUS AND METHOD

CROSS-REFERENCE TO RELATED APPLICATION

This application claims priority to and the benefit of Korean Patent Application No. 10-2020-0183970 filed in the Korean Intellectual Property Office on Dec. 24, 2020, the entire contents of which are incorporated herein by reference.

TECHNICAL FIELD

Embodiments disclosed herein relate to a battery management apparatus and method.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium-ion batteries. Among the secondary batteries, a lithium-ion battery has a much higher energy density than those of the conventional Ni/Cd batteries, Ni/MH batteries, etc. Moreover, the lithium-ion battery may be manufactured to be small and lightweight, such that the lithium-ion battery has been used as a power source of mobile devices. In addition, the lithium-ion battery is attracting attention as a next-generation energy storage medium as a usage range thereof is expanded to a power source of electric vehicles.

Furthermore, the secondary battery is generally used as a battery rack including a battery module where a plurality of battery cells are connected to one another in series and/or in parallel. The battery rack may be managed and controlled by a battery management system in terms of a state and an operation To calculate a capacity of a battery cell, generally, a calculation equation such as Ah counting, etc., may be used after charging and discharging of the battery cell are all completed. To release such a battery cell, the battery cell may be previously charged or discharged up to 300 cycles to check a capacity degradation rate, after which the battery cell is released. However, discharging of the battery cell up to 300 cycles may consume much time and cost.

DISCLOSURE

Technical Problem

Embodiments disclosed herein aims to provide a battery management apparatus and method in which a capacity of a battery cell may be predicted early by statistically analyzing state data measured in real time during charging and discharging of the battery cell.

Technical problems of the embodiments disclosed herein are not limited to the above-described technical problems, and other unmentioned technical problems would be clearly understood by one of ordinary skill in the art from the following description.

Technical Solution

A battery management apparatus according to an embodiment disclosed herein includes a calculating unit configured to calculate a differential value of a capacity of a battery cell with respect to a voltage of the battery cell, an analyzing unit configured to perform statistical analysis on the differential value, and a determining unit configured to determine the capacity of the battery cell based on the statistical analysis.

According to an embodiment, the analyzing unit may select, as a representative value, a maximum value among deviations of the differential value between charging/discharging cycles of the battery cell, and perform statistical analysis on the representative value.

According to an embodiment, the analyzing unit may calculate an approximation equation for the representative value and perform statistical analysis on a coefficient of the approximation equation.

According to an embodiment, the analyzing unit may perform K-means clustering on the coefficient of the approximation equation.

According to an embodiment, the determining unit may determine that the capacity of the battery cell is normal when the battery cell belongs to a predetermined cluster among a plurality of clusters.

According to an embodiment, the predetermined cluster may be the gradient of the approximation equation for the representative value is less than a reference value.

According to an embodiment, the battery management apparatus may further include a storing unit storing information about the plurality of clusters.

According to an embodiment, the determining unit may determine the capacity of the battery cell after performing charging/discharging of the battery cell up to a preset number of cycles, when the battery cell does not belong to the predetermined cluster.

According to an embodiment, the approximation equation may be a primary or quadratic polynomial.

A battery management method according to an embodiment disclosed herein includes calculating a differential value of a capacity of a battery cell with respect to a voltage of the battery cell, performing statistical analysis on the differential value, and determining the capacity of the battery cell based on the statistical analysis.

According to an embodiment, the battery management method may further include selecting, as a representative value, a maximum value among deviations of the differential value between charging/discharging cycles of the battery cell, in which the performing of the statistical analysis includes performing statistical analysis on the representative value.

According to an embodiment, the battery management method may further include performing K-means clustering on the coefficient of the approximation equation.

According to an embodiment, the determining unit may determine that the capacity of the battery cell is normal when the battery cell belongs to a predetermined cluster among a plurality of clusters.

According to an embodiment, the predetermined cluster may include a battery cell where the gradient of the approximation equation for the representative value is less than a reference value.

According to an embodiment, the battery management apparatus may further include a storing unit storing information about the plurality of clusters.

According to an embodiment, the determining unit may determine the capacity of the battery cell after performing charging/discharging of the battery cell up to a preset number of cycles, when the battery cell does not belong to the predetermined cluster.

According to an embodiment, the approximation equation may be a primary or quadratic polynomial.

A battery management method according to an embodiment disclosed herein includes calculating a differential value of a capacity of a battery cell with respect to a voltage of the battery cell, performing statistical analysis on the differential value, and determining the capacity of the battery cell based on the statistical analysis.

According to an embodiment, the battery management method may further include selecting, as a representative value, a maximum value among deviations of the differential value between charging/discharging cycles of the battery cell, in which the performing of the statistical analysis includes performing statistical analysis on the representative value.

According to an embodiment, the battery management method may further include calculating an approximation equation for the representative value, in which the performing of the statistical analysis includes performing statistical analysis on a coefficient of the approximation equation.

According to an embodiment, the battery management method may further include performing K-means clustering on the coefficient of the approximation equation.

According to an embodiment, the battery management method may further include determining that the capacity of the battery cell is normal when the battery cell belongs to a predetermined cluster among a plurality of clusters.

Advantageous Effects

A battery management apparatus and method according to an embodiment disclosed herein may early predict a capacity of a battery cell by statistically analyzing state data measured in real time during charging and discharging of the battery cell.

MODE FOR INVENTION

Figure 1:
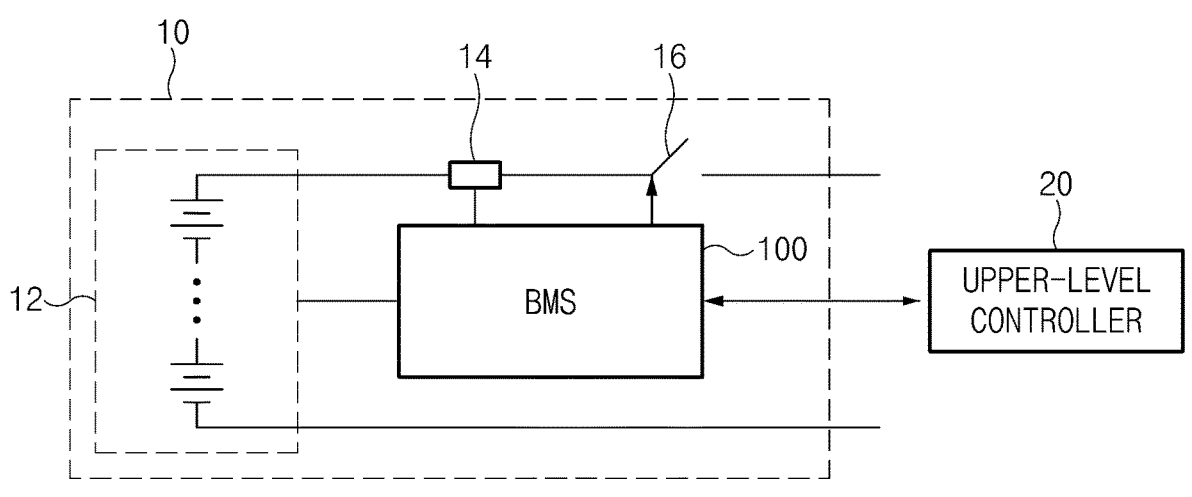
FIG. 1 is a block diagram of a general battery rack.

Hereinafter, various embodiments disclosed herein will be described in detail with reference to the accompanying drawings. In this document, identical reference numerals will be used for identical components in the drawings, and the identical components will not be redundantly described.

For various embodiments disclosed in this document, specific structural or functional descriptions are only exemplified for the purpose of describing the embodiments, and various embodiments disclosed herein may be implemented in various forms, and should not be construed as being limited to the embodiments described in this document.

As used in various embodiments, the terms "1st, "2nd", "first", "second", or the like may modify various components regardless of importance, and do not limit the components. For example, a first component may be named as a second component without departing from the right scope of an embodiment disclosed herein, and similarly, the second component may be named as the first component.

Terms used in the present document are used for only describing a specific exemplary embodiment of the disclosure and may not have an intention to limit the scope of other exemplary embodiments of the disclosure. It is to be understood that the singular forms include plural references unless the context clearly dictates otherwise.

All terms including technical and scientific terms used herein have the same meaning as commonly understood by one of ordinary skill in the art to which the embodiments disclosed herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments disclosed herein.

FIG. 1 is a block diagram of a general battery rack.

More specifically, FIG. 1 schematically shows a battery control system 1 including a battery rack 10 and an upper-level controller 20 included in a upper-level system according to an embodiment disclosed herein.

As shown in FIG. 1, the battery rack 10 may include a plurality of battery modules 12, a sensor 14, a switching unit 16, and a battery management system (BMS) 100. The battery rack 10 may include the battery module 12, the sensor 14, the switching unit 16, and the BMS 100 provided in plural.

The plurality of battery modules 12 may include at least one chargeable/dischargeable battery cell.

The sensor 14 may detect current flowing in the battery rack 10. In this case, a detected signal may be transmitted to the BMS 100.

The switching unit 16 may be connected in series to a (+) terminal side or a (−) terminal side of the battery module 12 to control the charging/discharging current flow of the battery module 12. For example, the switching unit 16 may use at least one relay, a magnetic contactor, etc., according to the specifications of the battery rack 10.

The BMS 100 may monitor the voltage, current, temperature, etc., of the battery rack 10 to perform control and management to prevent overcharging and over-discharging, etc., and may include, for example, a remote battery management system (RBMS).

The BMS 100, which is an interface for receiving measurement values of the above-described various parameter values, may include a plurality of terminals and a circuit, etc., connected thereto to process input values. The BMS 100 may control on/off of the switching unit 16, e.g., a relay, a contactor, etc., and may be connected to the battery module 12 to monitor the state of each battery module 12.

Meanwhile, in the BMS 100 disclosed herein, as will be described later, a differential value of the capacity with respect to the voltage of the battery cell, measured through a separate program, may be calculated, and the capacity of the battery cell may be predicted by statistically analyzing the differential value.

The upper-level controller 20 may transmit a control signal for controlling the battery module 12 to the BMS 100. Thus, the BMS 100 may be controlled in terms of an operation thereof based on a signal applied from the upper-level controller 20. Also, the battery module 12 may be a component included in an energy storage system (ESS). In this case, the upper-level controller 20 may be a controller (a BBMS) of a battery bank including the plurality of racks 10 or an ESS controller for controlling the entire ESS including a plurality of banks. However, the battery rack 10 is not limited to such a purpose.

Such configurations of the battery rack 10 and the battery management system 100 are well-known configurations, and thus will not be described in detail.

Figure 2:
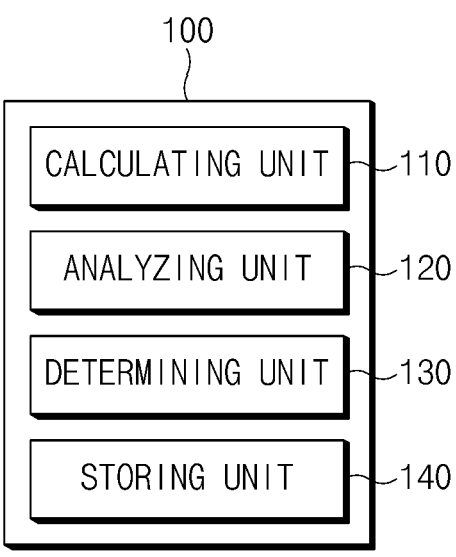
FIG. 2 is a block diagram illustrating a structure of a battery management apparatus, according to an embodiment disclosed herein.

FIG. 2 is a block diagram illustrating a structure of a battery management apparatus, according to an embodiment disclosed herein.

Referring to FIG. 2, the battery management apparatus 100 according to an embodiment disclosed herein may include a calculating unit 110, an analyzing unit 120, a determining unit 130, and a storing unit 140.

The calculating unit 110 may calculate a differential value of a capacity of a battery cell with respect to a voltage of the battery cell. More specifically, the calculating unit 110 may calculate a differential value of the capacity of the battery cell with respect to the voltage of the battery cell, dQ/dV, based on voltage and current of each battery cell for each charging/discharging cycle. In addition, the calculating unit 110 may store dQ/dV for each charging/discharging cycle, calculated for each battery cell, in the storing unit 140.

The analyzing unit 120 may perform statistical analysis on the differential value calculated by the calculating unit 110. More specifically, the analyzing unit 120 may select, as a representative value (hereinafter, described as nonfixV dQ/dV), a maximum value among deviations of a differential value between charging/discharging cycles of the battery cell, and perform statistical analysis on the selected representative value. In addition, the analyzing unit 120 may store, in the storing unit 140, each representative value calculated for each battery cell in each charging/discharging cycle.

The analyzing unit 120 may calculate an approximation equation for the representative value and perform statistical analysis on a coefficient of the approximation equation. For example, an approximation equation for a representative value may be a primary or quadratic polynomial. The approximation equation may be calculated through approximation to any number of charging/discharging cycles. For example, the approximation equation may be calculated for each battery cell, based on data from 1 to 4 cycles or data from 1 to 100 cycles. When the approximation equation calculated by the analyzing unit 120 is the quadratic equation, approximation closer to a general shape of a representative value may be possible, thus being useful for analysis focusing on the general shape, and when the approximation equation is the primary equation, approximation may be possible in such a way to emphasize a gradient of the representative value, allowing analysis focusing on a change amount.

In addition, the analyzing unit 120 may perform K-means clustering on the calculated coefficient of the approximation equation to classify the calculated coefficient into a preset number of clusters. At this time, each cluster may be classified based on the gradient of the representative value of the battery cell. This will be described with reference to FIG. 5.

The determining unit 130 may determine the capacity of the battery cell based on statistical analysis. More specifically, the determining unit 130 may determine that the capacity of the battery cell is normal, when the battery cell belongs to a predetermined cluster among a plurality of clusters calculated by the analyzing unit 120. In this case, the predetermined cluster may include a battery cell where the gradient of the representative value is less than a reference value. Meanwhile, when the battery cell does not belong to a predetermined cluster, the determining unit 130 may determine the capacity of the battery cell after charging and discharging the battery cell up to a preset number of cycles (e.g., 300 cycles).

The storing unit 140 may store information about the plurality of clusters. For example, the storing unit 140 may store information about a cluster previously calculated through K-means clustering by the analyzing unit 120. Moreover, the storing unit 140 may store data regarding a differential value and a representative value calculated for each battery cell.

Meanwhile, the battery management apparatus 100 according to an embodiment disclosed herein is described as including the storing unit 140 in FIG. 1, but the battery management apparatus 100 may include a communication unit instead of the storing unit 140. In this case, the battery management apparatus 100 may operate by storing various data, such as differential data or a representative value for each battery cell, information about a plurality of clusters, etc., in an external server and transmitting and receiving the data through a communication unit.

As such, the battery management apparatus 100 according to an embodiment disclosed herein may early predict a capacity of a battery cell by statistically analyzing state data measured in real time during charging and discharging of the battery cell.

Figure 3:
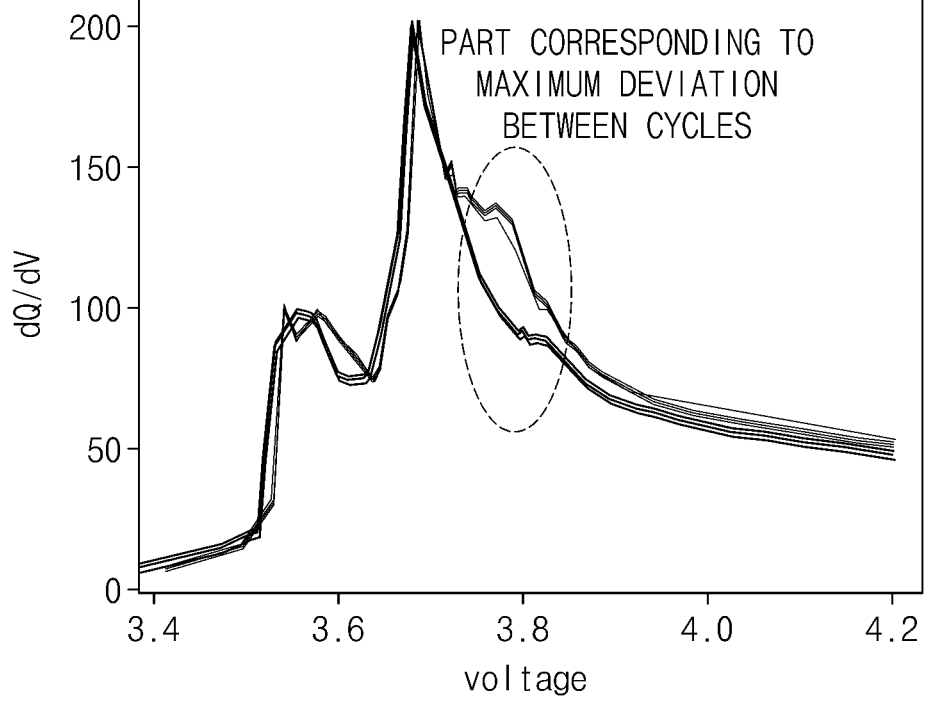
FIG. 3 is a view for describing a representative value selection process of a battery cell, according to an embodiment disclosed herein.

FIG. 3 is a view for describing selection of a maximum value among deviations of a differential value between charging/discharging cycles of a battery cell, as a representative value.

Referring to FIG. 3, an x axis indicates a voltage V of the battery cell, and a y axis indicates a differential data dQ/dV of a capacity with respect to the voltage of the battery cell. Each graph of FIG. 3 shows a differential value calculated for each charging/discharging cycle of the battery cell.

As shown in FIG. 3, the battery management apparatus 100 according to an embodiment disclosed herein may select, as the representative value, the maximum value among the deviations of the differential value between the charging/discharging cycles of the battery cell. The representative value calculated in this manner has a high correlation with the capacity of the battery as will be described below, such that it may be suitable to early predict the capacity of the battery cell without repeating charging/discharging cycles of the battery cell several times.

Figure 4:
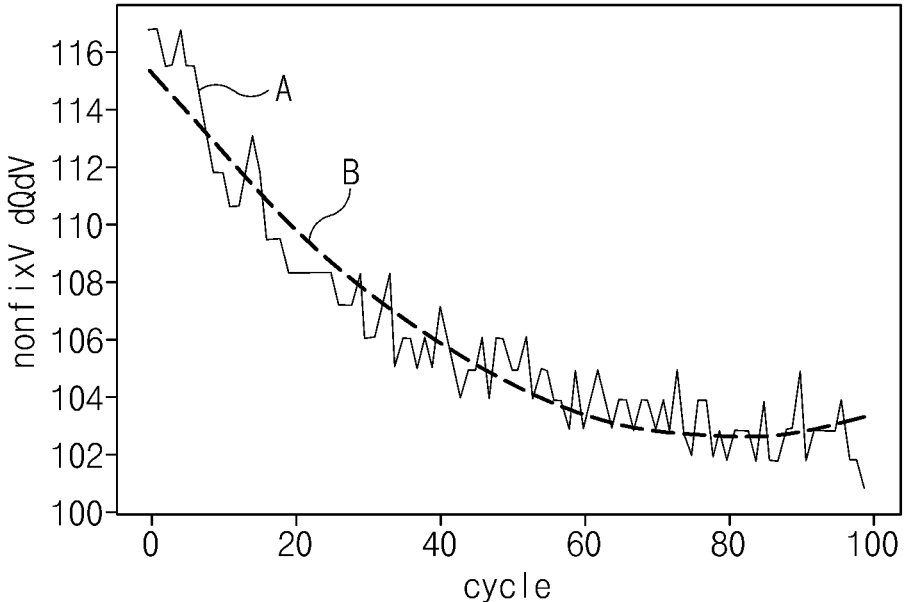
FIG. 4 is a view illustrating an approximation equation calculated for a representative value of a battery cell, according to an embodiment disclosed herein.

FIG. 4 is a view illustrating an approximation equation calculated for a representative value of a battery cell.

Referring to FIG. 4, an x axis indicates the number of charging/discharging cycles of a battery cell, and a y axis indicates a representative value nonfixV dQ/dV of the battery cell. At this time, a representative value of the y axis may a value corresponding to a maximum deviation between charging/discharging cycles in dQ/dV of the battery cell. FIG. 4 shows a graph A of a representative value of a battery cell and a graph B of an approximation equation of the representative value calculated using a quadratic polynomial (ax2+bx+c). As shown in FIG. 4, it may be seen that as a charging/discharging cycle progresses, the representative value decreases and appears in a form similar to the approximation equation.

Figure 5:
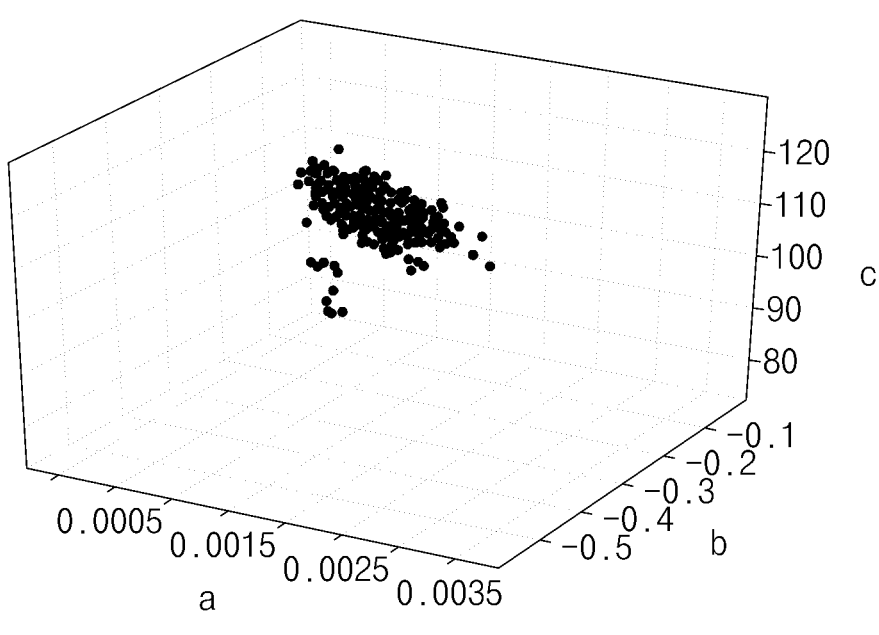
FIG. 5 is a view showing that K-means clustering is performed for a coefficient of an approximation equation for a calculated representative value of a battery cell, according to an embodiment disclosed herein.
Figure 5:
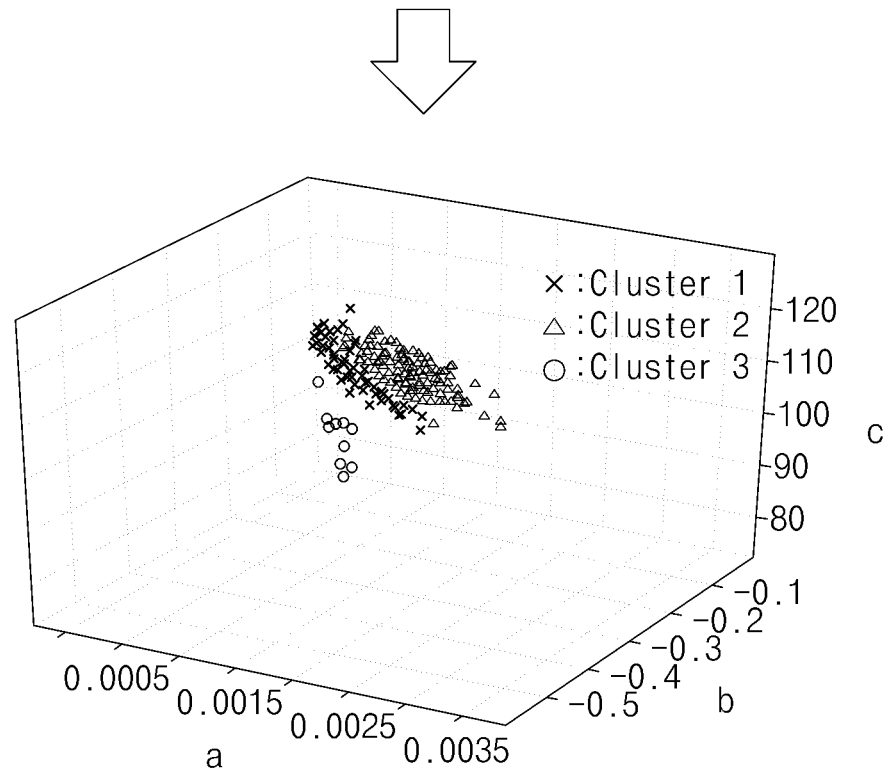

FIG. 5 is a view showing that K-means clustering is performed for a coefficient of an approximation equation for a representative value of a battery cell.

In a coordinate space shown in FIG. 5, each coordinate axis indicates each of a, b, and c axes corresponding to coefficients of an approximation equation of the representative value. In addition, each point of FIG. 5 may indicate the coefficient of the approximation equation for the representative value of each battery cell. In an example of FIG. 5, each battery cell is classified into three clusters Cluster 1 through Cluster 3 through K-means clustering. However, the current embodiment may not be limited thereto, and a cluster of each battery cell may be determined as any number.

Figure 6:
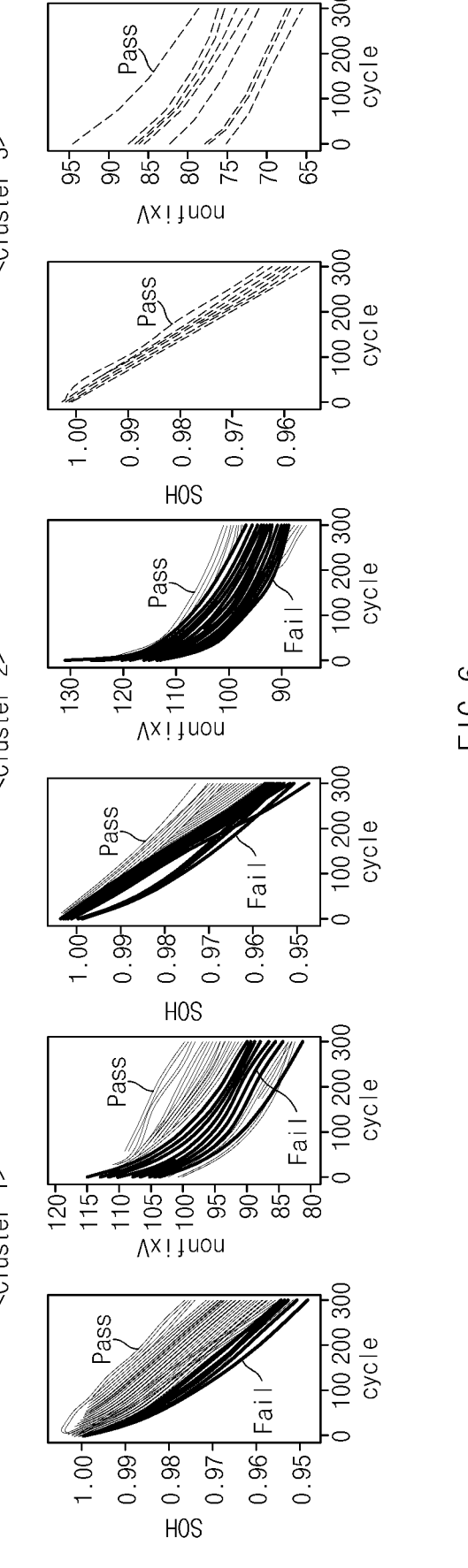
FIG. 6 is a view showing a state of health (SOH) and a representative value of battery cells included in each cluster classified by K-means clustering, according to an embodiment disclosed herein.

FIG. 6 is a view showing a state of health (SOH) and a representative value of battery cells included in each cluster classified by K-means clustering.

Referring to FIG. 6, a graph of Cluster 1 through Cluster 3 in the coordinate space shown in FIG. 5 is shown. In addition, graphs lightly indicated in Cluster 1 through Cluster 3 of FIG. 6 may show a case (Pass) where a capacity of a battery cell falls within a normal range and graphs boldly indicated may show a case (Fail) where the capacity of the battery cell is abnormal.

More specifically, FIG. 6 shows that after the above-described representative value is classified through K-means clustering, a capacity degradation test may be performed for each cluster to determine normality or abnormality. At this time, in FIG. 6, for Cluster 1, 226 battery cells among 242 battery cells are normal (Pass) and 16 battery cells are abnormal (Fail), and for Cluster 2, 154 battery cells among 197 battery cells are normal (Pass) and 43 battery cells are abnormal (Fail). On the other hand, for Cluster 3, all of 11 battery cells are normal.

As such, for Cluster 3 classified through K-means clustering, a gradient of a representative value indicating a maximum value among differential values of a battery cell is less than another cluster, such that a change amount after a certain cycle with respect to an initial representative value is small. Thus, with a battery management apparatus according to an embodiment disclosed herein, after each cluster is calculated in advance by performing K-means clustering on a representative value regarding a differential value of a battery cell, the degree of degradation is determined to fall within a normal range (Pass) when the battery cell belongs to a specific cluster (e.g., Cluster 3), thereby early estimating the capacity of the battery cell without repetition up to 300 cycles as in conventional art.

Figure 7:
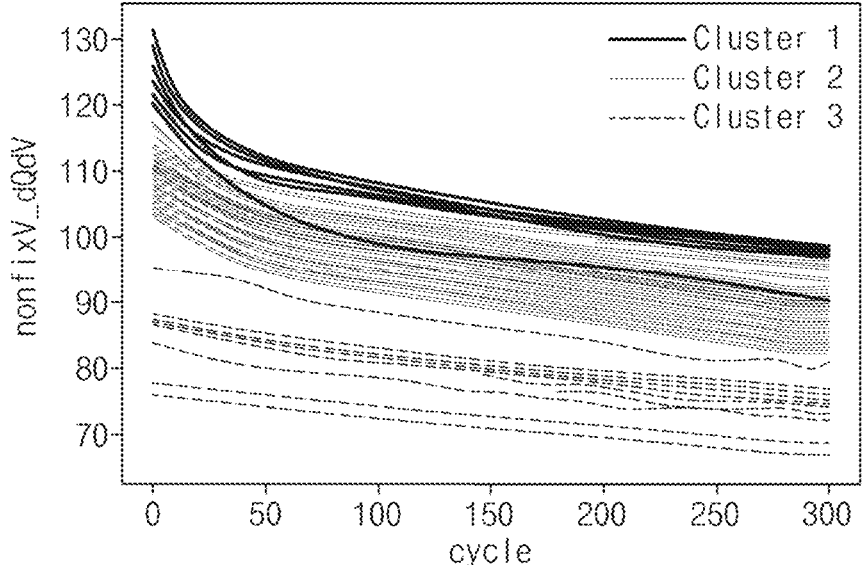
FIG. 7 is a view showing a graph of a representative value of a battery cell, classified by cluster, according to an embodiment disclosed herein.

FIG. 7 is a view showing a graph of a representative value of a battery cell, classified by cluster.

Referring to FIG. 7, an x axis indicates the number of charging/discharging cycles of a battery cell, and a y axis indicates a representative value regarding a differential value of the battery cell. It may be seen from FIG. 7 that, when compared to Cluster 1 and Cluster 2, for Cluster 3, a gradient of a representative value regarding a differential value with respect to a cycle appears gentle. That is, for a battery cell belonging to Cluster 3, a change of a representative value having a high correlation with an SOH is small, resulting in relatively small anode capacity degradation. Thus, when a specific belongs to Cluster 3 as a result of statistical analysis with the battery management apparatus disclosed herein, a charging/discharging test may be immediately stopped and the battery cell may be determined to be a battery cell having a normal degree of degradation.

Figure 8:
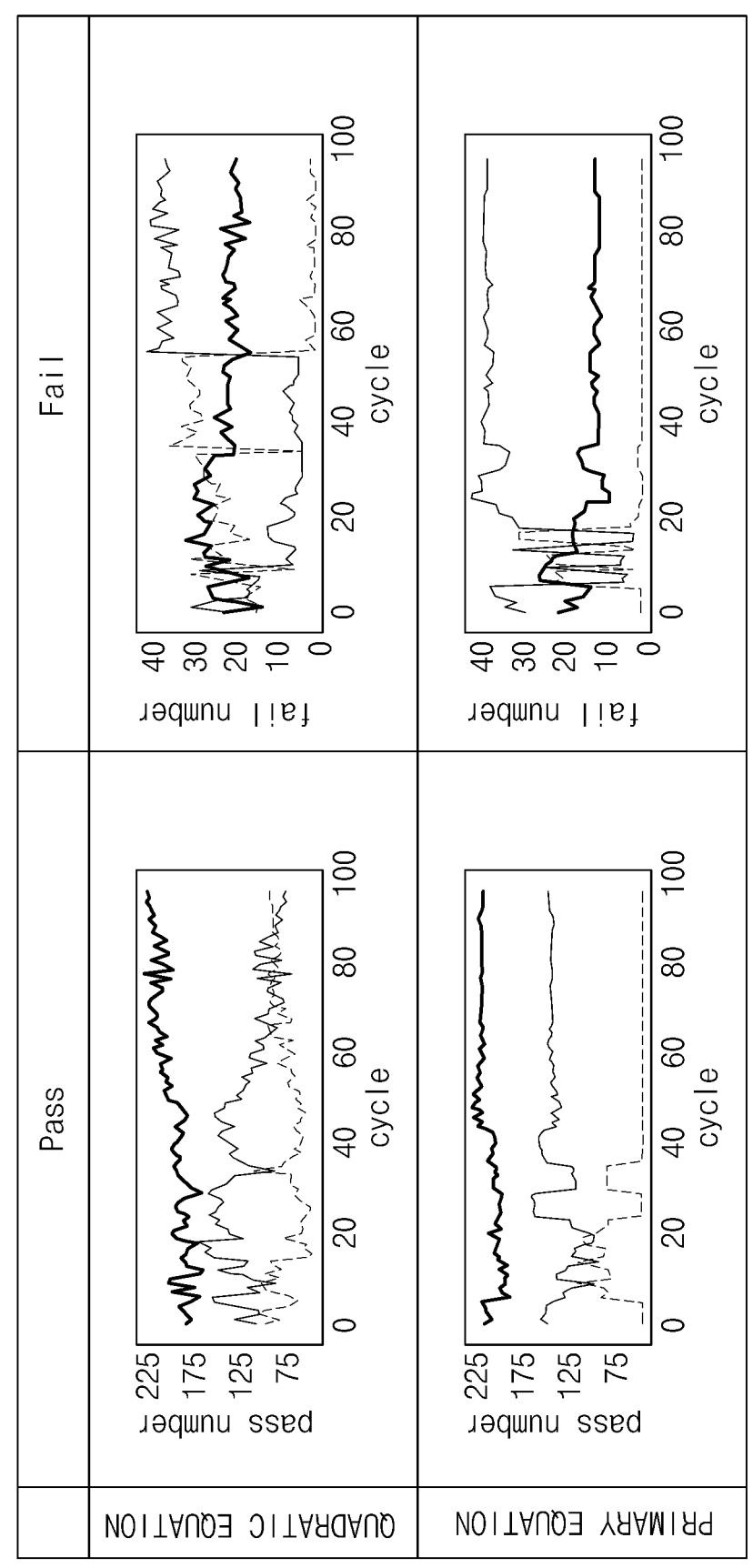
FIG. 8 is a view showing a calculated capacity degradation degree of battery cells included in each cluster with respect to a cycle, according to an embodiment disclosed herein.

FIG. 8 is a view showing a capacity degradation degree of battery cells included in each cluster with respect to a cycle.

Referring to FIG. 8, for a representative value that is a maximum deviation value between cycles regarding a differential value of a capacity of a battery cell with respect to a voltage of the battery cell, after approximation to a primary polynomial and a quadratic polynomial, respectively, normality (Pass) or abnormality (Fail) of the degree of capacity degradation is indicated. As shown in FIG. 8, at the beginning of the charging/discharging cycle of the battery cell, a normality/abnormality determination result spreads or vibrates, and after a specific number of cycles, a result gradually converges.

In particular, referring to FIG. 8, it may be seen that, when the representative value of the battery cell is approximated to the quadratic polynomial, focusing on a general shape, the result value of the degree of capacity degradation spreads or vibrates in both sides of normality and abnormality. On the other hand, in the case of approximation to the primary polynomial that maximizes the gradient of the representative value of the battery, the result value of the degree of capacity degradation converges from an initial stage. That is, as shown in FIG. 8, for the primary polynomial, in the case of Cluster 3, normality and abnormality converge from about a 36 cycle, and in particular, an abnormal (Fail) case is zero (0) after the 36 cycle, such that capacity degradation may be stably identified when compared to the quadratic polynomial.

As such, with the battery management apparatus according to an embodiment disclosed herein, the normality of the capacity caused by anode degradation of the battery cell may be determined early through statistical analysis on the representative value of the battery cell.

Figure 9:
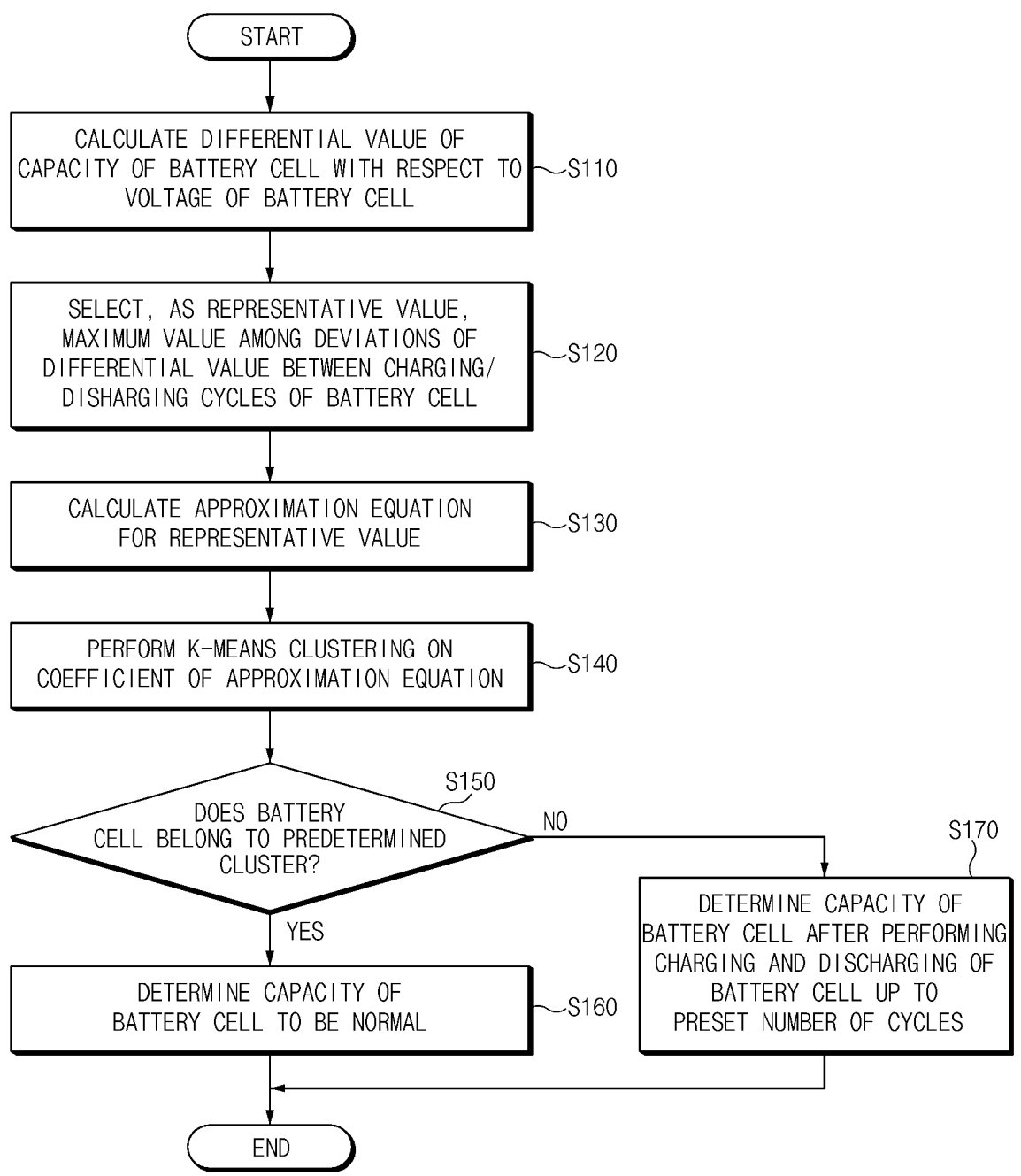
FIG. 9 is a flowchart illustrating a battery management method according to an embodiment disclosed herein.

FIG. 9 is a flowchart illustrating a battery management method according to an embodiment disclosed herein.

Referring to FIG. 9, a battery management method according to an embodiment disclosed herein may calculate a differential value of a capacity of a battery cell with respect to a voltage of the battery cell, in operation S110. More specifically, in operation S110, a differential value of the capacity of the battery cell with respect to the voltage of the battery cell, dQ/dV, may be calculated based on voltage and current of each battery cell for each charging/discharging cycle.

A maximum value among deviations of a differential value between charging/discharging cycles of the battery cell may be selected as a representative value in operation S120, and an approximation equation for the selected representative value may be calculated in operation S130. At this time, the approximation equation may be a primary or quadratic polynomial. As described above, when the approximation equation is the quadratic equation, approximation to a general shape of a representative value may be possible, thus being useful for analysis focusing on the general shape, and when the approximation equation is the first-order equation, analysis may be performed focusing on a change amount.

Next, in operation S140, K-means clustering may be performed on a coefficient of the approximation equation calculated in operation S130. Thus, each battery cell may be classified for each cluster according to a preset cluster number. Moreover, it is determined whether the battery cell belongs to a predetermined cluster in operation S150.

When the battery cell belongs to the predetermined cluster (YES), the capacity of the battery cell is determined to be normal, in operation S160. In this case, the predetermined cluster may include a battery cell where the gradient of the approximation equation for the representative value is less than a reference value. For example, the predetermined cluster may correspond to Cluster 3 described above. On the other hand, when the battery cell does not belong to the predetermined cluster (NO), the capacity of the battery cell may be determined after charging and discharging the battery cell up to a preset number of cycles (e.g., 300 cycles), in operation S170.

As such, with the battery management method according to an embodiment disclosed herein, a capacity of a battery cell may be early predicted by statistically analyzing state data measured in real time during charging and discharging of the battery cell.

Figure 10:
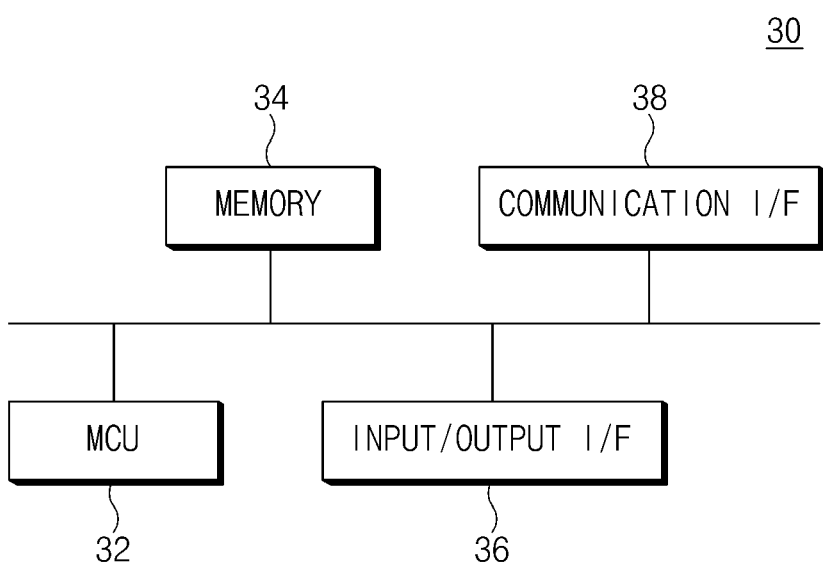
FIG. 10 is a block diagram illustrating a computing system that performs a battery management method according to an embodiment disclosed herein.

FIG. 10 is a block diagram illustrating a computing system that performs a battery management method according to an embodiment disclosed herein.

Referring to FIG. 10, a computing system 30 according to an embodiment disclosed herein may include a MCU 32, a memory 34, an input/output interface (I/F) 36, and a communication I/F 38.

The MCU 32 may be a processor that executes various programs (e.g., a differential value calculation program, a capacity prediction program, etc.) stored in the memory 34, processes various data including voltage, current, capacity, etc., of a battery cell through these programs, and executes the above-described functions of the battery management apparatus shown in FIG. 2.

The memory 34 may store various programs regarding differential value calculation and capacity prediction of the battery cell. Moreover, the memory 34 may store various data such voltage, current, differential value, representative value data, etc., of each battery cell.

The memory 34 may be provided in plural, depending on a need. The memory 34 may be a volatile memory or a nonvolatile memory. For the memory 34 as the volatile memory, random access memory (RAM), dynamic RAM (DRAM), static RAM (SRAM), etc., may be used. For the memory 34 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 34 are merely examples and are not limited thereto.

The input/output I/F 36 may provide an interface for transmitting and receiving data by connecting an input device such as a keyboard, a mouse, a touch panel, etc., and an output device such as a display, etc., with the MCU 32.

The communication I/F 340, which is a component capable of transmitting and receiving various data to and from a server, may be various types of devices capable of supporting wired or wireless communication. For example, a program for differential value and representative value calculation or capacity prediction of the battery cell or various data may be transmitted and received to and from a separately provided external server through the communication I/F 38.

As such, a computer program according to an embodiment disclosed herein may be recorded in the memory 34 and processed by the MCU 32, thus being implemented as a module that performs functions shown in FIG. 2.

Even though all components constituting an embodiment disclosed herein have been described above as being combined into one or operating in combination, the embodiments disclosed herein are not necessarily limited to the embodiments. That is, within the object scope of the embodiments disclosed herein, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art to which the embodiments disclosed herein pertain, unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present document.

The above description is merely illustrative of the technical idea of the present disclosure, and various modifications and variations will be possible without departing from the essential characteristics of embodiments of the present disclosure by those of ordinary skill in the art to which the embodiments disclosed herein pertains. Therefore, the embodiments disclosed herein are intended for description rather than limitation of the technical spirit of the embodiments disclosed herein and the scope of the technical spirit of the present disclosure is not limited by these embodiments disclosed herein. The protection scope of the technical spirit disclosed herein should be interpreted by the following claims, and all technical spirits within the same range should be understood to be included in the range of the present document.

The invention claimed is:

1. A battery management apparatus, comprising:
a calculating unit configured to calculate a plurality of differential values of a maximum capacity of a battery cell with respect to a voltage of the battery cell;
an analyzing unit configured to perform statistical analysis on the plurality of differential values; and
a determining unit configured to determine the capacity of the battery cell based on the statistical analysis and classify a state of the battery cell as normal or abnormal so as to control a charging or discharging of the battery cell based on the determined state of the battery cell,
wherein the analyzing unit is configured to:
select, as a representative value, a maximum deviation value among deviations of the plurality of differential values between charging/discharging cycles of the battery cell and
perform the statistical analysis on the representative value,
wherein the maximum deviation value among the deviations of the plurality of differential values between the charging/discharging cycles of the battery cell includes a maximum deviation value that does not correspond to peak differential values between the charging/discharging cycles of the battery cell, and wherein the maximum deviation value is a difference between a value of two different differential curves of the plurality of differential values.

2. The battery management apparatus of claim 1, wherein the analyzing unit is further configured to:

calculate an approximation equation for the representative value, and perform the statistical analysis on a coefficient of the approximation equation.

3. The battery management apparatus of claim 2, wherein the analyzing unit is further configured to perform K-means clustering on the coefficient of the approximation equation.

4. The battery management apparatus of claim 3, wherein the determining unit is further configured to determine that the capacity of the battery cell is normal when the battery cell belongs to a predetermined cluster among a plurality of clusters.

5. The battery management apparatus of claim 4, wherein the predetermined cluster comprises an absolute value of a gradient of the approximation equation for the representative value is less than a reference value.

6. The battery management apparatus of claim 4, further comprising a storing unit that is configured to store information about the plurality of clusters.

7. The battery management apparatus of claim 4, wherein the determining unit is further configured to determine the capacity of the battery cell after performing charging/discharging of the battery cell up to a preset number of cycles, when the battery cell does not belong to the predetermined cluster.

8. The battery management apparatus of claim 2, wherein the approximation equation is a primary or quadratic polynomial.

9. A battery management method comprising:

calculating a plurality of differential values of a maximum capacity of a battery cell with respect to a voltage of the battery cell;

selecting, as a representative value, a maximum deviation value among deviations of the plurality of differential values between charging/discharging cycles of the battery cell;

performing statistical analysis on the plurality of differential values;

determining the capacity of the battery cell based on the statistical analysis;

classifying a state of the battery cell as normal or abnormal based on the determined capacity of the battery cell so as to control a charging or discharging of the battery cell based on the determined state of the battery cell, wherein the performing of the statistical analysis comprises performing statistical analysis on the representative value, wherein the maximum deviation value among the deviations of the plurality of differential values between the charging/discharging cycles of the battery cell includes a maximum deviation value that does not correspond to peak differential values of the charging/discharging cycles of the battery cell, and wherein the maximum deviation value is a difference between a value of two different differential curves of the plurality of differential values.

10. The battery management method of claim 9, further comprising calculating an approximation equation for the representative value, wherein the performing of the statistical analysis comprises performing statistical analysis on a coefficient of the approximation equation.

11. The battery management method of claim 10, further comprising performing K-means clustering on the coefficient of the approximation equation.

12. The battery management method of claim 11, further comprising determining that the capacity of the battery cell is normal when the battery cell belongs to a predetermined cluster among a plurality of clusters.

* * * * *